United States Patent
'T Mannetje et al.

[19]

[11] Patent Number: 6,144,442
[45] Date of Patent: *Nov. 7, 2000

[54] PNEUMATIC SUPPORT DEVICE WITH A CONTROLLED GAS SUPPLY, AND LITHOGRAPHIC DEVICE PROVIDED WITH SUCH A SUPPORT DEVICE

[75] Inventors: Jacob J. 'T Mannetje; Frank Auer, both of Eindhoven, Netherlands

[73] Assignees: U.S. Philips Corp, New York, N.Y.; ASM Lithography B.V., Veldhoven, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 09/090,034

[22] Filed: Jun. 10, 1998

[30] Foreign Application Priority Data

Oct. 23, 1997 [EP] European Pat. Off. .............. 97203288

[51] Int. Cl.[7] ............................. G03B 27/60; G03B 27/42
[52] U.S. Cl. ................................................. 355/73; 355/53
[58] Field of Search ................................ 355/30, 53, 67, 355/73, 74, 75, 77; 318/625, 632; 250/492.2; 356/399–401

[56] References Cited

U.S. PATENT DOCUMENTS

| | | | |
|---|---|---|---|
| 4,044,866 | 8/1977 | Ishida | 188/322 |
| 4,491,160 | 1/1985 | Axthammer et al. | 141/349 |
| 4,786,947 | 11/1988 | Kosugi et al. | 355/30 |
| 4,909,488 | 3/1990 | Seibert et al. | 267/64.11 |
| 5,047,965 | 9/1991 | Zlokovitz | 364/558 |
| 5,844,664 | 12/1998 | Van Kimmenade | 355/53 |
| 5,844,666 | 12/1998 | Van Engelen et al. | 355/72 |
| 5,877,843 | 3/1999 | Takagi et al. | 355/30 |
| 5,892,572 | 4/1999 | Nishi | 355/67 |

FOREIGN PATENT DOCUMENTS

| | | |
|---|---|---|
| 96/38766 | 12/1996 | WIPO . |
| WO9638766 | 12/1996 | WIPO . |

*Primary Examiner*—Russell Adams
*Assistant Examiner*—Hung Henry Nguyen
*Attorney, Agent, or Firm*—F. Brice Faller

[57] ABSTRACT

Support device (53) provided with a first part (69) and a second part (71) which is supported relative to the first part by means of a gas spring (73) having a pressure chamber (75). A gas supply (117), which compensates for gas leakage from the pressure chamber (75) during operation, is connected to an intermediate space (119) which is in communication with the pressure chamber (75) via a pneumatic restriction (121). The gas pressure present in the intermediate space (119) is held as constant as possible during operation by means of a control loop (123), to prevent transmission of pressure fluctuations which are present in the gas supply (117) to the pressure chamber (75) as much as possible. Such pressure fluctuations are undesirable in the pressure chamber because they cause mechanical vibrations in the second part of the support device and the device to be supported. The support device is used in a lithographic device for the support of a frame (39) with respect to a base (37), the frame (39) supporting a focusing unit (5).

8 Claims, 3 Drawing Sheets

PNEUMATIC SUPPORT DEVICE WITH A CONTROLLED GAS SUPPLY, AND LITHOGRAPHIC DEVICE PROVIDED WITH SUCH A SUPPORT DEVICE

BACKGROUND OF THE INVENTION

The invention relates to a support device provided with a first part, a second part, a gas spring with a pressure chamber for supporting the second part relative to the first part parallel to a support direction, and a gas supply for the supply of gas to the pressure chamber.

The invention also relates to a lithographic device provided with a radiation source, a mask holder, a focusing unit with a main axis, a positioning device with a substrate holder which is displaceable relative to the focusing unit parallel to an X-direction which is perpendicular to the main axis and parallel to a Y-direction which is perpendicular to the X-direction and perpendicular to the main axis, a frame which supports at least the focusing unit parallel to a support direction, and a base which supports the frame by means of at least three support devices which each exert a supporting force on the frame which is directed parallel to the support direction.

A support device and a lithographic device of the kinds mentioned in the opening paragraphs are known from WO-A-96/38766, to which U.S. Pat. No. 5,844,664 corresponds. The known lithographic device is used in the manufacture of integrated semiconductor circuits by means of an optical lithographic process. The radiation source in the known lithographic device is a light source, and the focusing unit is an optical lens system by means of which a sub-pattern of an integrated semiconductor circuit, which sub-pattern is present on a mask which can be placed on the mask holder, is imaged on a reduced scale on a semiconductor substrate which can be placed on the substrate holder. Such a semiconductor substrate comprises a large number of fields on which identical semiconductor circuits are provided. The individual fields are for this purpose consecutively exposed through the mask, a next field of the semiconductor substrate being brought into position relative to the focusing unit by the positioning device between two consecutive exposure steps each time. This process is repeated a number of times, each time with another mask with a different sub-pattern, so that integrated semiconductor circuits with comparatively complicated structures can be manufactured. Since such structures have detail dimensions which lie in the submicron range, the sub-patterns present on the consecutive masks must be imaged on the fields of the semiconductor substrate with an accuracy which lies in the submicron range. The substrate holder and the mask holder should accordingly occupy accurate positions relative to the focusing unit during operation.

The frame of the known lithographic device is supported in a vertical direction by means of three support devices of the known kind, the first parts of the support devices being fastened to the base of the lithographic device, and the second parts of the support devices being fastened to the frame. The frame of the known lithographic device supports not only the focusing unit but also the mask holder and the substrate holder in the vertical direction, while the base can be placed on a floor. Since the substrate holder and the mask holder have to occupy accurate positions relative to the focusing unit during operation, vibrations of the frame are to be prevented as much as possible during operation. Such vibrations of the frame may be caused by vibrations in the base which arise, for example, from floor vibrations. Vibrations in the base of the known lithographic device are in addition caused by reaction forces of the positioning device of the substrate holder and reaction forces of a further positioning device by means of which the mask holder is displaceable relative to the focusing unit. The three support devices accordingly serve not only for supporting the frame in the vertical direction, but also for preventing a transmission of vibrations from the base to the frame.

The pressure chamber of the gas spring of the known support device is bounded by a cylindrical cup and by an annular membrane by means of which the cup is suspended in the pressure chamber of the gas spring. The cup is fastened to the second part by means of three comparatively thin tension rods which are positioned in the cup and which extend parallel to the support direction. To prevent a transmission of vibrations from the base to the frame as much as possible, a mass spring system formed by the support devices and the frame together with the components of the lithographic device supported by the frame should have natural frequencies which are as low as possible parallel to the support direction as well as perpendicular to the support direction. The pressure chamber of the gas spring of the known support device has a comparatively large volume for providing a natural frequency of said mass spring system which is as low as possible parallel to the support direction. The tension rods mentioned above have a comparatively great length in order to provide a natural frequency of said mass spring system which is as low as possible in directions perpendicular to the support direction.

The gas supply of the known support device is connected to a valve which is mounted in a wall of the pressure chamber. Since an average gas pressure prevailing in the pressure chamber will fall during operation as a result of inter alia gas leakage through the membrane, gas is to be supplied to the pressure chamber via the gas supply at regular intervals. During the supply of gas, pressure fluctuations present in the gas supply are transmitted to the pressure chamber. Such pressure fluctuations are caused, for example, by a compressor connected to the gas supply. The pressure fluctuations in the pressure chamber cause mechanical vibrations of the second part of the support device, which are transmitted to the frame of the lithographic device. The accuracy of the lithographic device is adversely affected thereby. To prevent such an undesirable adverse effect on the accuracy of the known lithographic device, this lithographic device must be stopped while gas is being supplied to the pressure chambers of the support devices, which adversely affects the production output of the lithographic device.

SUMMARY OF THE INVENTION

It is an object of the invention to provide a support device mentioned in the opening paragraph in which the transmission of pressure fluctuations present in the gas supply to the pressure chamber is prevented as much as possible, and to provide a lithographic device.

According to the invention, the gas supply is connected to an intermediate space which is connected to the pressure chamber via a pneumatic restriction, and gas pressure prevailing in the intermediate space is controlled.

A gas flow from the intermediate space to the pressure chamber will arise in the pneumatic restriction mentioned above when a supply of gas takes place from the gas supply to the intermediate space. This gas flow experiences a predetermined resistance in the pneumatic restriction. Comparatively low-frequency pressure fluctuations of the gas in the intermediate space are transmitted to the pressure chamber through the restriction, whereas comparatively high-frequency pressure fluctuations of the gas in the intermediate space are strongly damped by the resistance of the restriction before being transmitted to the pressure chamber. The pneumatic restriction together with the pressure chamber thus forms a so-called pneumatic low-pass filter for the pressure fluctuations prevailing in the intermediate space. The pressure fluctuations prevailing in the intermediate space are limited by the use of means for controlling the gas pressure present in the intermediate space and have an amplitude which is determined by the accuracy of said means. The already limited pressure fluctuations in the intermediate space having a frequency above a predetermined, comparatively low threshold frequency are transmitted to the pressure chamber with a strong damping as a result of a suitable design of the restriction. The transmission of pressure fluctuations present in the gas supply to the pressure chamber is thus prevented as much as possible by the use of the means and the pneumatic restriction. It is in addition possible as a result of this for a permanent supply of gas from the gas supply to the intermediate space and the pressure chamber to take place, so that a leakage of gas from the pressure chamber is permanently compensated and a substantially constant gas pressure is provided in the pressure chamber. In addition, a suitable design of the restriction can provide an optimum, so-called critical damping of low-frequency resonance vibrations of the gas spring. Such resonance vibrations have a frequency which follows from the volume of the pressure chamber and the gas pressure prevailing in the pressure chamber.

Since each of the support devices used in the lithographic device according to the invention is a support device according to the invention, a transmission of pressure fluctuations present in the gas supply of the support devices to the pressure chambers and a transmission of mechanical vibrations caused thereby in the second parts to the frame of the lithographic device are prevented as much as possible, so that the accuracy of the lithographic device is affected as little as possible by said pressure fluctuations. The lithographic device need not be stopped at intervals because a permanent supply of gas takes place from the gas supply to the pressure chambers of the support devices.

A special embodiment of a support device according to the invention is characterized in that the intermediate space comprises a connection channel which connects the gas supply to the pneumatic restriction. The intermediate space need have a comparatively small volume only because the gas pressure prevailing in the intermediate space is controlled during operation. Utilization of the connection channel as the intermediate space required in accordance with the invention provides a practical and compact construction of the support device.

A further embodiment of a support device according to the invention is characterized in that the means for controlling the gas pressure prevailing in the intermediate space are provided with a pressure sensor for measuring gas pressure, a controllable gas valve positioned between the gas supply and the intermediate space, and an electric controller for controlling the gas valve as a function of the gas pressure measured by the pressure sensor. The gas pressure prevailing in the intermediate space is kept constant as much as possible during operation by means of the pressure sensor, the gas valve, and the controller, so that pressure fluctuations in the intermediate space are limited as much as possible. Pressure fluctuations having a limited amplitude are admissible in the intermediate space because a transmission of the pressure fluctuations present in the intermediate space to the pressure chamber is prevented as much as possible through the use of the pneumatic restriction. The pressure sensor, the gas valve, and the controller mentioned above therefore need not have a particularly high accuracy.

A yet further embodiment of a support device according to the invention is characterized in that the pressure chamber is bounded by a cylindrical inner wall of an intermediate part of the support device and by a piston which is displaceable in the intermediate part parallel to the support direction and which is supported perpendicularly to the support direction relative to the intermediate part by a static gas bearing which is present between the inner wall of the intermediate part and an outer wall of the piston, while the intermediate part is supported parallel to the support direction by the first part and the piston is fastened to the second part, the static gas bearing being provided with a gas supply channel which is connected to the pressure chamber. The static gas bearing exerts substantially no forces on the piston in directions parallel to the support direction. In addition, the piston is suitable for the use of a sealing gap between the outer wall of the piston and the inner wall of the intermediate part, for sealing off the pressure chamber of the gas spring. Such a sealing gap also exerts substantially no forces on the piston in directions parallel to the support direction. The support device thus has a stiffness parallel to the support direction which is determined substantially exclusively by a stiffness of the gas spring, so that a stiffness of the support device which is as low as possible parallel to the support direction is achievable through a suitable design of the gas spring. As a result of this, the mass spring system in the lithographic device according to the invention, formed by the support devices used therein and by the frame with the components of the lithographic device supported thereby, has a natural frequency which is as low as possible parallel to the support direction, so that the transmission of vibrations directed parallel to the support direction from the base to the frame is prevented as much as possible. The fact that the static gas bearing in this embodiment has a gas supply channel which is connected to the pressure chamber means that a considerable gas leakage takes place from the pressure chamber to the static gas bearing during operation. Said gas leakage, however, is permanently compensated by a supply of gas from the gas supply of the support device.

A special embodiment of a support device according to the invention is characterized in that the intermediate part is supported relative to the first part parallel to the support direction by means of a further static gas bearing by which the intermediate part is guided over a support surface of the first part so as to be displaceable perpendicularly to the support direction, the further static gas bearing being provided with a further gas supply channel which is connected to the pressure chamber. The further static gas bearing has a very high stiffness, seen parallel to the support direction, so that the presence of the further static gas bearing has substantially no influence on the stiffness which the support device has parallel to the support direction and which is substantially entirely determined by the stiffness of the gas spring. The further static gas bearing exerts substantially no forces on the intermediate part in directions perpendicular to the support direction, so that the intermediate part is displaceable relative to the first part substantially without friction in directions perpendicular to the support direction. The support device accordingly has a stiffness which is substantially zero perpendicular to the support direction. In the lithographic device according to the invention, therefore, the natural frequency of the mass spring system formed by the support devices according to this further embodiment of the invention as used therein and by the frame with the components of the lithographic device supported thereby is substantially zero in directions perpendicular to the support direction, so that the transmission of vibrations directed perpendicularly to the support direction from the base to the frame is substantially entirely prevented. The considerable gas leakage which occurs in operation from the pressure chamber to the further static gas bearing is also permanently compensated by a supply of gas from the gas supply of the support device.

DETAILED DESCRIPTION OF THE PREFERRED EMBODIMENTS

Figure 1:
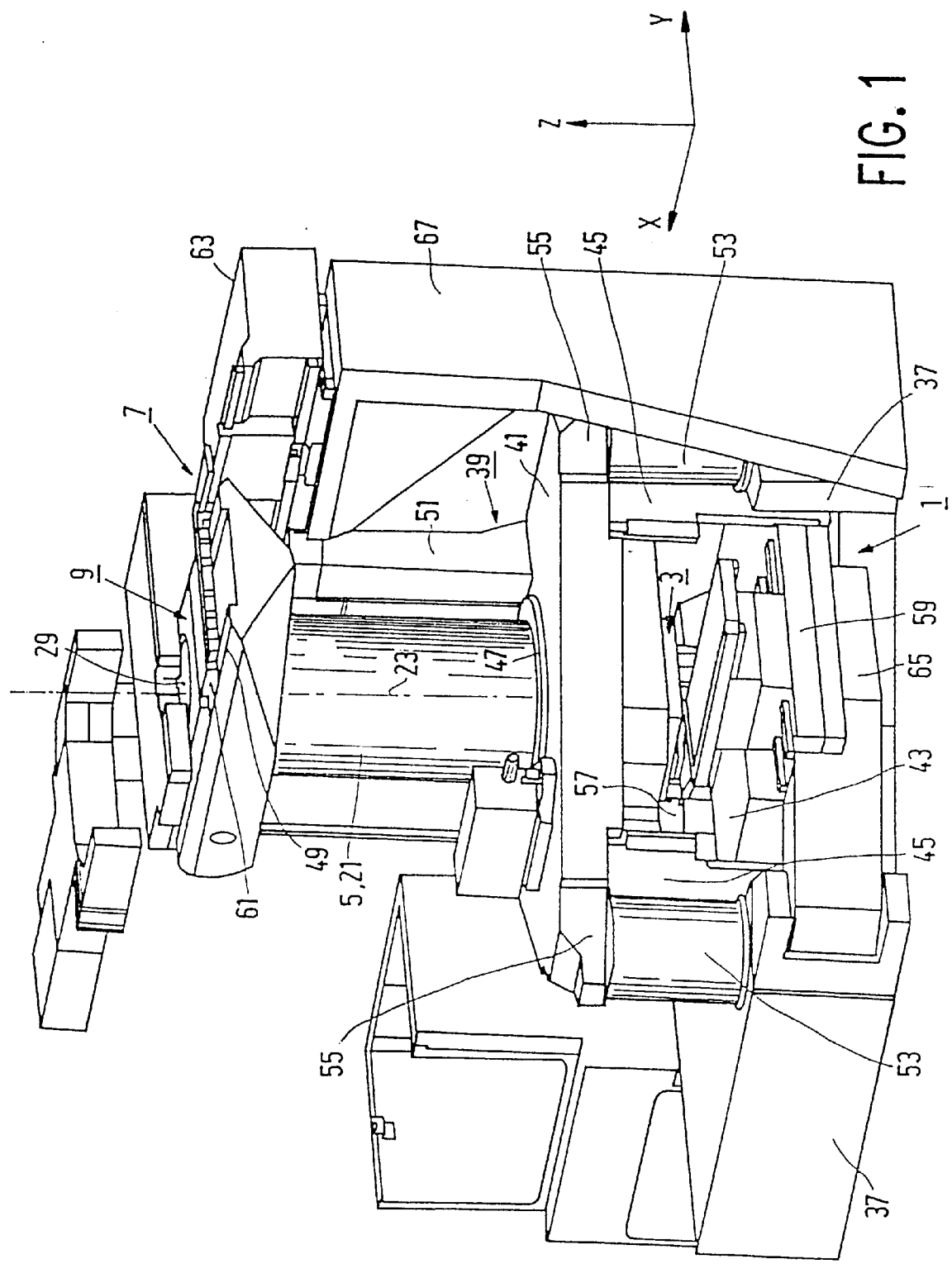
FIG. 1 shows a lithographic device according to the invention.
Figure 2:
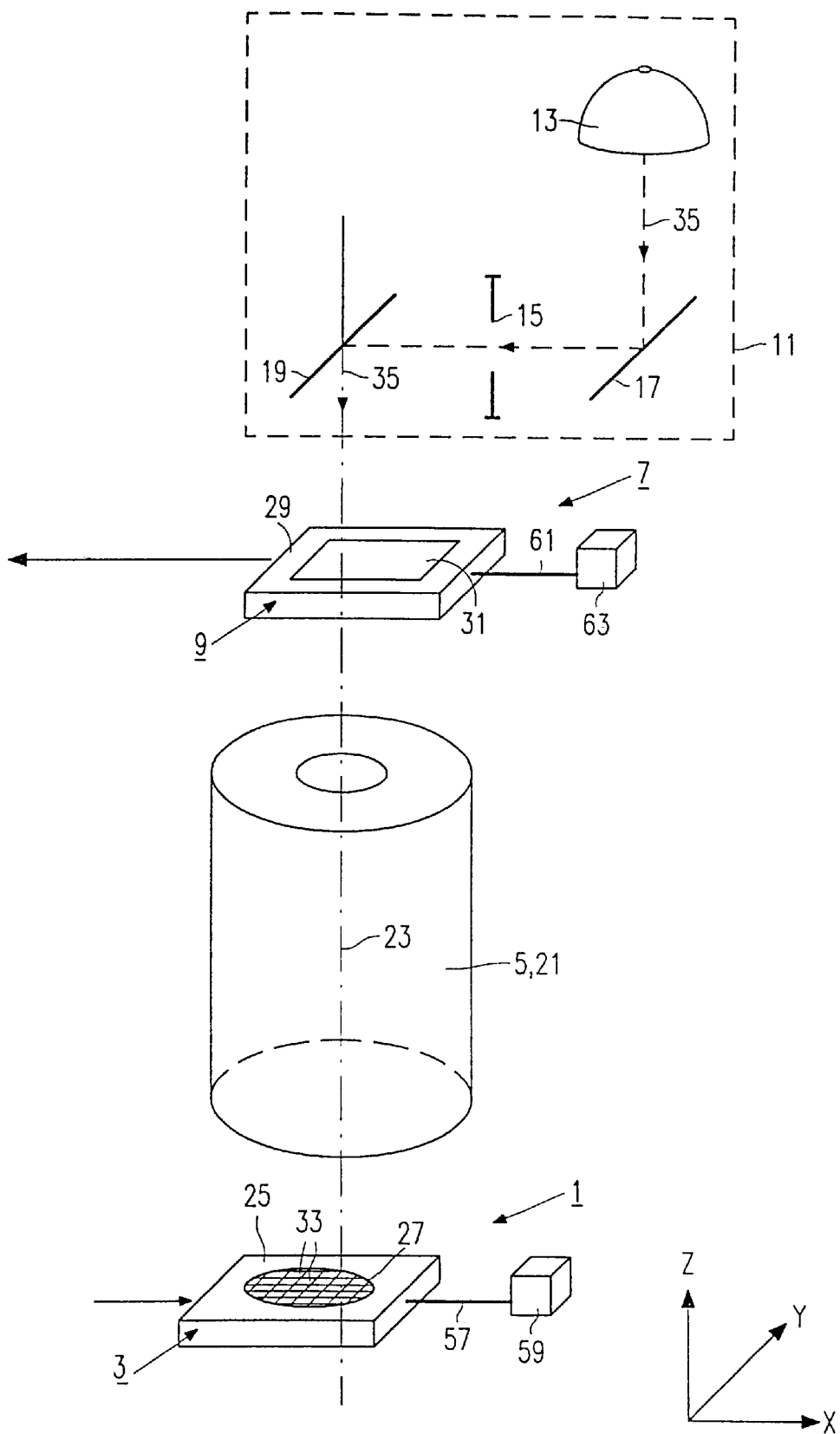
FIG. 2 is a diagram representing the lithographic device of FIG. 1.

The lithographic device according to the invention shown in FIGS. 1 and 2 is suitable for use in the manufacture of integrated semiconductor circuits in a lithographic process. As FIGS. 1 and 2 show, the lithographic device is provided parallel to a vertical Z-direction in that order with a positioning device 1 with a substrate holder 3, a focusing unit 5, a further positioning device 7 with a mask holder 9, and a radiation source 11. The lithographic device is an optical lithographic device in which the radiation source 11 comprises a light source 13, a diaphragm 15, and mirrors 17 and 19, while the focusing unit 5 is an imaging or projection system which is provided with an optical lens system 21 with an optical main axis 23 directed parallel to the Z-direction and an optical reduction factor which is, for example, 4 or 5. The substrate holder 3 comprises a support surface 25, which extends perpendicularly to the Z-direction and on which a semiconductor substrate 27 can be placed, and is displaceable relative to the focusing unit 5 parallel to an X-direction which is perpendicular to the Z-direction and parallel to a Y-direction which is perpendicular to the X-direction and perpendicular to the Z-direction by means of the positioning device 1. The mask holder 9 comprises a support surface 29, which extends perpendicularly to the Z-direction and on which a mask 31 can be placed, and is displaceable parallel to the X-direction relative to the focusing unit 5 by means of the further positioning device 7.

The semiconductor substrate 27 comprises a large number of fields 33 on which identical semiconductor circuits are provided, while the mask 31 comprises a pattern or a sub-pattern of a single integrated semiconductor circuit. The individual fields 33 of the semiconductor substrate 27 are consecutively exposed through the mask 31 during operation. A light beam 35 originating from the light source 13 is guided through the diaphragm 15 and along the mirrors 17, 19 through the mask 31 during an exposure step and is focused on an individual field 33 of the semiconductor substrate 27 by the focusing unit 5, such that the pattern present on the mask 31 is imaged on a reduced scale on said field 33 of the semiconductor substrate 27. An imaging method following the so-called "step and scan" principle is used in the lithographic device shown, according to which the semiconductor substrate 27 and the mask 31 are synchronously displaced during an exposure step relative to the focusing unit 5 parallel to the X-direction by means of the positioning device 1 and the further positioning device 7, respectively, while after an exposure of an individual field 33 a next field 33 of the semiconductor substrate 27 is brought into position relative to the focusing unit 5 each time in that the substrate holder 3 is displaced in steps parallel to the X-direction and/or parallel to the Y-direction by means of the positioning device 1. In this manner the pattern present on the mask 31 is scanned parallel to the X-direction and imaged on the consecutive fields 33 of the semiconductor substrate 27. This process is repeated a number of times, with a different mask comprising a different pattern or sub-pattern each time, so that integrated semiconductor circuits with complicated layered structures can be manufactured. Such structures have detail dimensions which lie in the submicron range. Therefore, the patterns or sub-patterns present on the masks should be imaged on the semiconductor substrates with an accuracy which also lies in the submicron range, so that very high requirements are imposed on the accuracy with which the substrate holder 3 and the mask holder 9 can be positioned relative to the focusing unit 5 by means of the positioning device 1 and the further positioning device 7, respectively.

As FIG. 1 further shows, the lithographic device has a base 37 which can be placed on a horizontal floor. The lithographic device further comprises a frame 39 which supports the substrate holder 3, the focusing unit 5, and the mask holder 9, seen in a direction parallel to a vertical support direction which extends parallel to the Z-direction. The frame 39 is provided with a triangular, comparatively stiff metal main plate 41 which extends transversely to the optical main axis 23 of the focusing unit 5 and which is provided with a central light passage opening which is not visible in FIG. 1. The substrate holder 3 is displaceably guided over a support 43 of the frame 39, which support extends perpendicularly to the Z-direction and is suspended from a lower side of the main plate 41 by means of three vertical suspension plates 45. It is noted that only two of the three suspension plates 45 are partly visible in FIG. 1. The focusing unit 5 is fastened to the main plate 41 by means of a mounting ring 47 which is fastened to the focusing unit 5 adjacent a lower side thereof. The mask holder 9 is displaceably guided over a further support 49 of the frame 39 which extends parallel to the X-direction. The further support 49 is fastened to a vertical, comparatively stiff metal column 51 of the frame 39 which is fastened on the main plate 41. The base 37 supports the frame 39 parallel to the vertical support direction by means of three support devices 53 according to the invention which are mutually arranged in a triangle and which each exert a supporting force on the main plate 41 of the frame 39 in directions parallel to the support direction. The main plate 41 for this purpose has three corner portions 55 with which the main plate 41 rests on the three support devices 53. It is noted that only two of the three corner portions 55 of the main plate 41 and two of the three support devices 53 are visible in FIG. 1.

As is apparent from FIG. 1 and from the diagram of FIG. 2, the positioning device 1 comprises a first part 57 and a second part 59, while the further positioning device 7 comprises a first part 61 and a second part 63. The first parts 57 and 61 are fastened to the substrate holder 3 and the mask holder 9, respectively, while the second parts 59 and 63 are fastened to the base 37. The second parts 59 and 63 exert driving forces on the respective first parts 57 and 61 during operation, whereupon the first parts 57 and 61 exert reaction forces on the respective second parts 59 and 63. As is visible in FIG. 1, the second part 59 of the positioning device 1 is fastened to a comparatively stiff metal arm 65 which is fastened to the base 37, while the second part 63 of the positioning device 7 is fastened to a further comparatively stiff metal column 67 which is also fastened to the base 37. Reaction forces of the positioning device 1 and the further positioning device 7 are thus transmitted to the base 37. Vibrations are caused in the base 37 under the influence of the reaction forces. Since the base 37 is placed on a floor, moreover, vibrations will arise in the base 37 under the influence of vibrations present in the floor. A transmission of the vibrations present in the base 37 during operation via the support devices 53 to the frame 39 must be prevented as much as possible because the frame 39 supports the substrate holder 3, the mask holder 9, and the focusing unit 5, seen parallel to the vertical support direction, and because very stringent requirements are imposed on the accuracy with which the substrate holder 3 and the mask holder 9 can be positioned with respect to the focusing unit 5 by means of the positioning device 1 and the further positioning device 7, respectively. The support devices 53 are accordingly provided with means, to be described further below, for preventing a transmission of vibrations from the base 37 to the frame 39.

Figure 3:
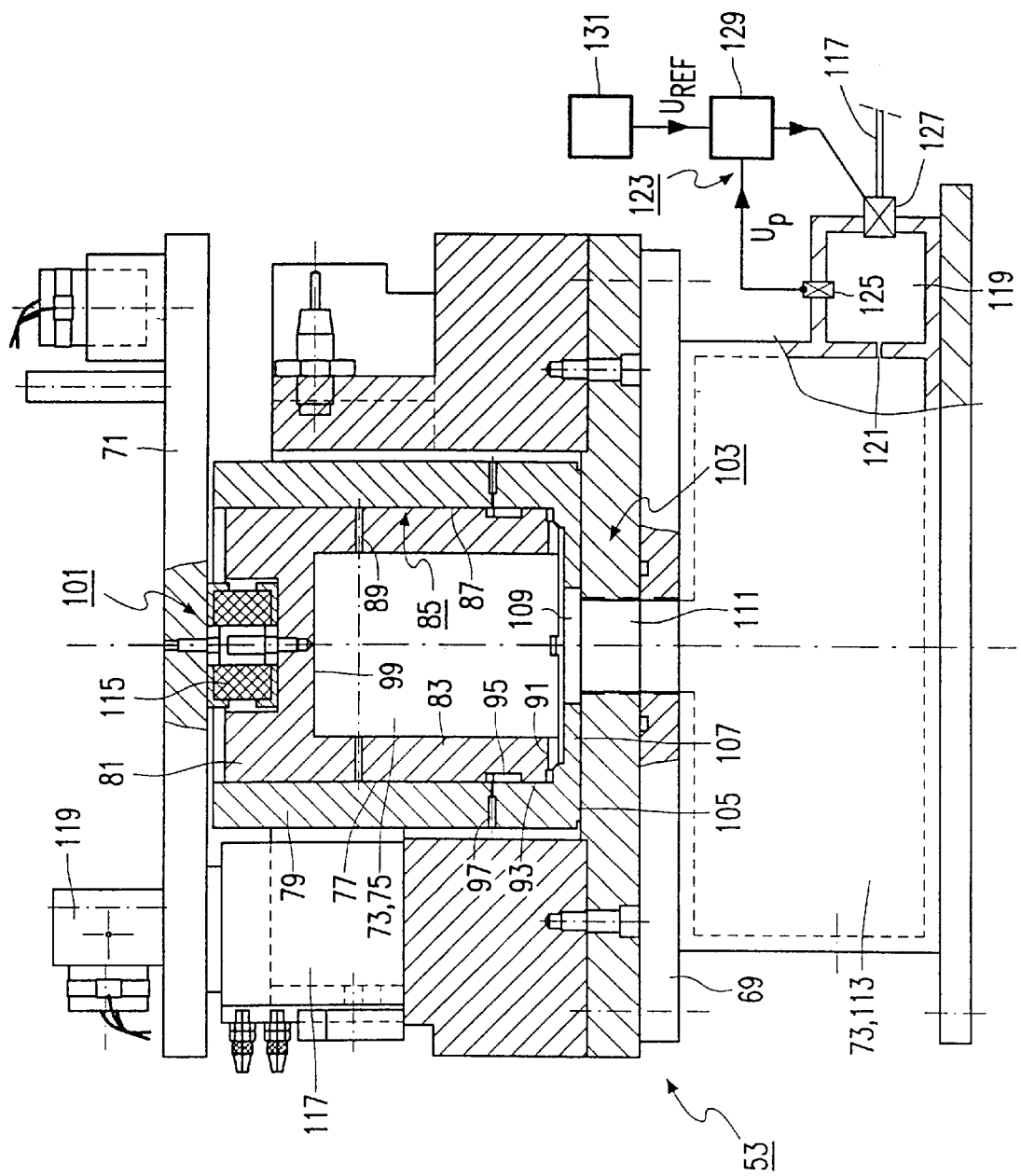
FIG. 3 diagrammatically and in cross-section shows a support device according to the invention suitable for use in the lithographic device of FIG. 1.

As FIG. 3 shows, each of the support devices 53 according to the invention used in the lithographic device according to the invention comprises a first support part 69 which can be fastened to the base 37 of the lithographic device, a second support part 71 which can be fastened to the frame 39 of the lithographic device, and a gas spring 73 for supporting the second part 71 with respect to the first part 69 by means of a supporting force which is directed parallel to the vertical support direction. The gas spring 73 comprises a pressure chamber 75 in which a comparatively high gas pressure prevails during operation. The pressure chamber 75 is bounded by a cylindrical inner wall 77 of a cup-shaped intermediate part 79 of the support device 53 and by a piston 81 which is displaceable in the intermediate part 79 parallel to the support direction. The piston 81 comprises a sleeve 83 which is supported relative to the intermediate part 79 in directions perpendicular to the support direction by means of a static gas bearing 85 which is present between the cylindrical inner wall 77 of the intermediate part 79 and a cylindrical outer wall 87 of the sleeve 83. The static gas bearing 85 is a conical gap bearing which is usual and known per se and is provided with a gas supply channel 89 provided in the sleeve 83 and connected to the pressure chamber 75. The use of the gas supply channel 89 provided in the sleeve 83 achieves a particularly simple and practical gas supply channel for the static gas bearing 85, so that the static gas bearing 85 and the piston 81 have a simple and practical construction. A sealing gap 93, by means of which a leakage of gas from the pressure chamber 75 along the piston 81 is prevented as much as possible, is present between the inner wall 77 of the intermediate part 79 and the outer wall 87 of the sleeve 83 adjacent a lower side 91 of the sleeve 83. A collector groove 95 for gas leaking along the sealing gap 93 and for gas flowing from the static gas bearing 85 is provided in the outer wall 87 of the sleeve 83 between the sealing gap 93 and the static gas bearing 85. The collector groove 95 is in communication with a number of discharge channels 97 provided in the intermediate part 79 for the removal of the gas present in the collector groove 95 to the surroundings. The use of the collector groove 95 and the discharge channels 97 prevents the operation of the static gas bearing 85 from being affected by gas which leaks along the sealing gap 93. The supporting force supplied by the support device 53 parallel to the vertical support direction accordingly is a gas force exerted by the gas in the pressure chamber 75 on the annular lower side 91 of the sleeve 83 and on an inner wall 99 of the piston 81 which extends transversely to the support direction.

As FIG. 3 shows, the piston 81 is fastened to the second part 71 via a connection member 101 which is to be described in detail further below, while the cup-shaped intermediate part 79 is supported relative to the first part 69 parallel to the vertical support direction by means of a further static gas bearing 103. The further static gas bearing 103 again is a conical gap bearing which is usual and known per se and is arranged between a support surface 105 of the first part 69 which extends perpendicularly to the vertical support direction and a bottom wall 107, also extending perpendicularly to the vertical support direction, of the intermediate part 79 which bounds the pressure chamber 75. The cup-shaped intermediate part 79 is guided substantially without friction over the support surface 105 of the first part 69 by means of the further static gas bearing 103, and is thus displaceable substantially without friction with respect to the first part 69 in directions perpendicular to the vertical support direction. A through passage 109 of the gas spring 73 is centrally provided in the bottom wall 107 of the intermediate part 79. The through passage 109 is arranged opposite a further through passage 111 of the gas spring 73 which is provided in the support surface 105 of the first part 69 and is connected to a main chamber 113 of the gas spring 73 present in the first part 69. The pressure chamber 75 of the gas spring 73 provided in the intermediate part 79 is thus in communication with the main chamber 113 of the gas spring 73 provided in the first part 69 via the through passage 109 and the further through passage 111. As FIG. 3 shows, the conical bearing gap of the further static gas bearing 103 directly merges into the through passage 109 provided in the bottom wall 107 of the intermediate part 79, so that the through passage 109 at the same time constitutes a gas supply channel of the further static gas bearing 103 which is in communication with the pressure chamber 75. Since the through passage 109 in the bottom wall 107 of the intermediate part 79 thus has a dual function, a particularly simple and practical construction of the further static gas bearing 103 and the gas supply channel used therein is obtained. The fact that the further static gas bearing 103 is present between the support surface 105 of the first part 69 and the bottom wall 107 of the intermediate part 79 means that the further static gas bearing 103 is pretensioned in a simple and practical manner during operation parallel to the vertical support direction by means of the gas pressure prevailing in the pressure chamber 75, such that a supporting force directed parallel to the support direction and exerted by the gas in the conical bearing gap of the further static gas bearing 103 on the intermediate part 79 is largely compensated by a force opposed to said supporting force and exerted by the gas in the pressure chamber 75 on the bottom wall 107. Despite the fact that the gas in the conical bearing gap of the further static gas bearing 103 on average will have a lower pressure than the gas in the pressure chamber 75, such a compensation is possible because a surface of the bottom wall 107 bounding the bearing gap is larger than a surface of the bottom wall 107 bounding the pressure chamber 75.

The gas springs 73 of the support devices according to the invention used in the lithographic device according to the invention together with the frame 39 and the components of the lithographic device supported by the frame 39 form a mass spring system in which the frame 39 is displaceable relative to the base 37 parallel to the vertical support direction and perpendicularly to the vertical support direction, and is rotatable relative to the base 37 about an axis of rotation directed parallel to the vertical support direction and pivotable about two mutually perpendicular pivot axes which are perpendicular to the vertical support direction. Displacements of the frame 39 relative to the base 37 parallel to the support direction are possible in that the pistons 81 of the support devices 53 are displaceable parallel to the support direction in the intermediate parts 79, while displacements of the frame 39 relative to the base 37 directed perpendicularly to the support direction are possible in that the intermediate parts 79 of the support devices 53 are displaceable perpendicularly to the support direction with respect to the first parts 69. Rotations of the frame 39 about an axis of rotation directed parallel to the support direction are possible in that the intermediate parts 79 of the support devices 53 are rotatable relative to the first parts 69 about an axis of rotation directed parallel to the support direction through the use of the further static gas bearings 103. Pivoting movements of the frame 39 about the pivot axes perpendicular to the support direction are possible in that the pistons 81 of the support devices 53 are fastened to the second parts 71 via the connection members 101 mentioned above. As FIG. 3 shows, the connection members 101 each comprise a simple rubber ring 115 which is substantially undeformable parallel to the support direction and which is flexible about two mutually perpendicular bending axes which are perpendicular to the support direction. To prevent a transmission of vibrations from the base 37 to the frame 39 of the lithographic device and from the first parts 69 to the second parts 71 of the support devices 53 as much as possible, said mass spring system has natural frequencies which are as low as possible in directions parallel to the support direction and perpendicular to the support direction, about said axis of rotation which is directed parallel to the support direction, and about said pivot axes which are perpendicular to the support direction, i.e. the support devices 53 have stiffness values which are as low as possible seen parallel to the support direction, seen perpendicularly to the support direction, seen about said axis of rotation directed parallel to the support direction, and seen about said pivot axes directed perpendicularly to the support direction.

A lowest possible stiffness of the support device 53 parallel to the support direction is achieved in that the gas spring 73 is given a volume which is as large as possible. For this purpose, the gas spring 73 is provided not only with the pressure chamber 75 but also with the main chamber 113 described above and connected to the pressure chamber 75. The use of the main chamber 113 renders it possible to limit the volume of the pressure chamber 75, so that the dimensions and weight of the displaceable intermediate part 79 can be reduced. Since the pressure chamber 75 according to the invention is bounded by the piston 81 which is displaceably guided in the intermediate part 79 by means of the static gas bearing 85, the stiffness of the support device 53 as seen parallel to the support direction is determined substantially exclusively by the stiffness of the gas spring 73. The static gas bearing 85 and the sealing gap 93 indeed exert substantially no frictional forces on the piston 81 parallel to the support direction. Neither is the stiffness of the support device 53 parallel to the support direction substantially influenced by the presence of the connection member 101, which is substantially undeformable parallel to the support direction, or by the presence of the further static gas bearing 103, which also has a very high stiffness parallel to the support direction. Since the stiffness of the support device 53 parallel to the support direction is substantially entirely determined by the stiffness of the gas spring 73, a sufficiently low stiffness of the gas spring 73 is achieved through a suitable design of the pressure chamber 75 and the main chamber 113, so that the transmission of vibrations directed parallel to the support direction from the first part 69 to the second part 71 of the support device 53 is prevented as much as possible.

Since the intermediate part 79 of the support device 53 is displaceable substantially without friction over the support surface 105 of the first part 69 by means of the further static gas bearing 103, the support device 53 has a stiffness which is substantially zero, seen perpendicularly to the support direction, and the mass spring system of the lithographic device mentioned above has a natural frequency which is also substantially zero, seen perpendicularly to the support direction. A transmission of vibrations directed perpendicularly to the support direction from the base 37 and the first part 69 to the frame 39 and the second part 71 is substantially entirely prevented thereby.

The intermediate part 79 of the support device 53 is rotatable substantially without friction over the support surface 105 of the first part 69 owing to the use of the further static gas bearing 103, so that the support device 53 has a stiffness which is also substantially zero about an axis of rotation directed parallel to the support direction, and the transmission of rotational vibrations of the first part 69 about an axis of rotation directed parallel to the support direction to the second part 71 of the support device 53 is also substantially entirely prevented.

The rubber ring 115 used in the connection member 101 has a limited bending stiffness about said bending axes directed perpendicularly to the support direction. The transmission of rotational vibrations of the first part 69 about a pivot axis perpendicular to the support direction from the first part 69 to the second part 71 of the support device 53 is already sufficiently prevented through the use of said rubber ring 115 with its limited bending stiffness because such rotational vibrations substantially do not occur or are comparatively small during operation.

The gas supply channel 89 of the static gas bearing 85 and the through passage 109 which forms the gas supply channel for the further static gas bearing 103 are in communication with the pressure chamber 75, so that a considerable gas leakage takes place during operation from the pressure chamber 75 via the static gas bearing 85 and the further static gas bearing 103. In addition, a comparatively small gas leakage takes place during operation from the pressure chamber 75 through the sealing gap 93. To compensate for gas leaks during operation, the support device 53 has a gas supply 117 for the supply of gas to the pressure chamber 75. The gas supply 117 is connected, for example, to a compressor which is usual and known per se and which is not shown in the Figures for simplicity's sake. In such a gas supply 117, pressure fluctuations will arise under normal operational conditions, comprising both comparatively low-frequency components and comparatively high-frequency components. Such pressure fluctuations are caused, for example, by the compressor mentioned above. A transmission of such pressure fluctuations to the pressure chamber 75 is undesirable because such pressure fluctuations in the pressure chamber 75 would lead to mechanical vibrations of the second part 71 of the support device 53 which would be transmitted to the frame 39 of the lithographic device. To prevent a transmission of such pressure fluctuations from the gas supply 117 to the pressure chamber 75 as much as possible, the gas supply 117 is connected to an intermediate space 119 of the support device 53 shown in FIG. 3, and the intermediate space 119 is connected to the pressure chamber 75 by means of a pneumatic restriction 121, while the support device 53 is provided with a control loop 123 for controlling a gas pressure prevailing in the intermediate space 119. The pneumatic restriction 121 is, for example, a comparatively narrow permanently open passage through which gas can flow from the intermediate space 119 to the main chamber 113 of the gas spring 73 during operation. While flowing through the restriction 121, the gas will experience a resistance which follows from the shape and dimensions of the passage in the restriction 121. As FIG. 3 further shows, the control loop 123 comprises a pressure sensor 125 for measuring the gas pressure prevailing in the intermediate space 119, a controllable gas valve 127 arranged between the gas supply 117 and the intermediate space 119, and an electrical controller 129. The pressure sensor 125, the gas valve 127, and the controller 129 are depicted diagrammatically only in FIG. 3 and are each of a kind which is usual and known per se. During operation, the pressure sensor 125 supplies a first electric signal $u_P$ to the controller 129 which corresponds to a gas pressure measured by the pressure sensor 125 in the intermediate space. The control loop 123 further comprises an adjustment member 131 by means of which a desired gas pressure $p_{REF}$ can be set by a user of the lithographic device. The adjustment member 131 supplies a first electrical signal $u_{REF}$ to the controller 129 during operation, corresponding to the desired gas pressure $p_{REF}$. The controller 129 controls the gas valve 127 during operation such that the gas pressure in the intermediate space 119 approximates the gas pressure $p_{REF}$ desired and set by the user as closely as possible. A gas pressure is achieved in the intermediate space 119 in this manner which has a substantially constant average value and which fluctuates to a limited degree only during operation. Since the gas experiences a predetermined resistance in the restriction 121, comparatively high-frequency pressure fluctuations in the intermediate space 119 are transmitted via the restriction 121 to the main chamber 113 and the pressure chamber 75 with strong damping. Comparatively low-frequency pressure fluctuations substantially do not arise in the intermediate space 119 as a result of the operation of the control loop 123. The pneumatic restriction 121 thus forms a so-called pneumatic low-pass filter in conjunction with the main chamber 113 and the pressure chamber 75 for the pressure fluctuations present in the intermediate space 119, which fluctuations are already limited by the control loop 123. This pneumatic low-pass filter will have a comparatively low threshold frequency between, for example, 0.5 and 1.0 Hz owing to a suitable design of the restriction 121, so that pressure fluctuations in the intermediate space 119 having a frequency above this threshold frequency are transmitted to the main chamber 113 and the pressure chamber 75 with strong damping only. The co-operation between the control loop 123 and the pneumatic restriction 121 thus prevents a transmission of pressure fluctuations present in the gas supply 117 to the pressure chamber 75 as much as possible, so that substantially no mechanical vibrations are caused in the second part 71 of the support device 53 and in the frame 39 of the lithographic device by said pressure fluctuations. Since the pressure fluctuations in the gas supply 117 thus have substantially no adverse influence on the accuracy of the lithographic device, a permanent, uninterrupted supply of gas to the pressure chamber 75 through the gas supply 117 is admissible, so that the considerable gas leakages from the pressure chamber 75 to the static gas bearing 85 and the further static gas bearing 103 are permanently compensated during operation by a supply of gas from the gas supply 117, and no pressure losses occur in the pressure chamber 75 during operation.

As was noted above, the mass spring system formed by the gas springs 73 of the support devices 53, the frame 39, and the components of the lithographic device supported by the frame 39 has a comparatively low natural frequency seen parallel to the support direction. The restriction 121 not only has the function of a pneumatic low-pass filter for the pressure fluctuations present in the intermediate space 119 as described above, but also a second function, i.e. the damping of low-frequency resonance vibrations of this mass spring system. Since the damping properties of the restriction 121 in this mass spring system are also determined by the shape and dimensions of the restriction 121, a substantially optimum, so-called critical damping of this mass spring system is achieved also by a suitable design of the restriction 121, such that the mass spring system will return from a disturbed state into an equilibrium state in the shortest possible time.

A limited amplitude of the pressure fluctuations in the intermediate space 119 is admissible because the restriction 121 together with the main chamber 113 and the pressure chamber 75 forms a pneumatic low-pass filter for the pressure fluctuations present in the intermediate space 119. The control loop 123 and the pressure sensor 125, the gas valve 127, and the controller 129 used therein accordingly need not have a particularly high accuracy and may thus be of a simple kind. It is noted that alternative means for controlling the gas pressure prevailing in the intermediate space 119 may be used instead of the control loop 123 described above. Thus, for example, the control loop 123 may be replaced by a pneumatic control valve which is usual and known per se between the gas supply 117 and the intermediate space 119, by means of which also a substantially constant gas pressure is adjustable in the intermediate space 119.

The intermediate space 119 shown in FIG. 3 is an auxiliary chamber which is positioned between the gas supply 117 and the main chamber 113 of the gas spring 73. The intermediate space 119 need have a comparatively small volume only in relation to the gas spring 73 because the gas flow occurring during operation from the gas supply 117 via the intermediate space 119 to the gas spring 73 is comparatively small, and the gas pressure prevailing in the intermediate space 119 is permanently controlled by the control loop 123. The intermediate space 119 may accordingly be formed in a manner other than the auxiliary chamber shown in FIG. 3. Thus the intermediate space 119, for example, may be a comparatively short connecting channel which connects the gas supply 117 to the restriction 121, the gas valve 127 being arranged between the gas supply 117 and connecting channel. A practical and compact construction of the support device according to the invention is obtained in this manner.

In the support device 53 according to the invention described above, the gas leakage from the pressure chamber 75 takes place mainly through the static gas bearing 85 and the further static gas bearing 103. It is noted that the invention also covers support devices of a different kind in which a gas leakage from the pressure chamber used therein takes place in a different manner. An example of this is the support device known from WO-A-96/38766 discussed above, in which a gas leakage from the pressure chamber takes place mainly via a membrane by means of which the second part of the support device is suspended relative to the first part.

An imaging method which follows the so-called "step and scan" principle is used in the lithographic device according to the invention described above. It is noted that the invention also relates to lithographic devices in which an imaging method following the "step and repeat" principle is used, wherein the mask and the semiconductor substrate are held in constant positions relative to the focusing unit during the exposure of the semiconductor substrate.

The frame 39 in the lithographic device according to the invention described above supports not only the focusing unit 5 but also the substrate holder 3 and the mask holder 9. It is noted that the invention also relates to lithographic devices in which the substrate holder and the mask holder are supported by alternative supporting units of the lithographic devices. Since at least the focusing unit has to occupy an accurately defined position in such lithographic devices, the invention relates to lithographic devices in which the frame supported by the support devices according to the invention supports at least the focusing unit.

It is finally noted that a support device according to the invention may be used not only in a lithographic device but also, for example, in machining devices, machine tools, and other machines or installations in which the transmission of vibrations to certain components to be supported by the support device is to be prevented as much as possible.

What is claimed is:

1. A support device comprising a first support part, a second support part, a gas spring with a pressure chamber for supporting the second support part relative to the first support part parallel to a support direction, an intermediate space which is connected to the pressure chamber via a pneumatic restriction, a gas supply connected to the intermediate space, and means for controlling a gas pressure prevailing in said intermediate space.

2. A support device as claimed in claim 1, characterized in that the intermediate space comprises a connection channel which connects the gas supply to the pneumatic restriction.

3. A support device as claimed in claim 1, characterized in that the means for controlling the gas pressure prevailing in the intermediate space are provided with a pressure sensor for measuring said gas pressure, a controllable gas valve positioned between the gas supply and the intermediate space, and an electric controller for controlling the gas valve as a function of the gas pressure measured by the pressure sensor.

4. A support device as claimed in claim 1, characterized in that the pressure chamber is bounded by a cylindrical inner wall of an intermediate part of the support device and by a piston which is displaceable in the intermediate part parallel to the support direction and which is supported perpendicularly to the support direction relative to the intermediate part by a static gas bearing which is present between the inner wall of the intermediate part and an outer wall of the piston, while the intermediate part is supported parallel to the support direction by the first support part and the piston is fastened to the second support part, the static gas bearing being provided with a gas supply channel which is connected to the pressure chamber.

5. A support device as claimed in claim 4, characterized in that the intermediate part is supported relative to the first support part parallel to the support direction by means of a further static gas bearing by which the intermediate part is guided over a support surface of the first support part so as to be displaceable perpendicularly to the support direction, the further static gas bearing being provided with a further gas supply channel which is connected to the pressure chamber.

6. A lithographic device provided with a radiation source, a mask holder, a focusing unit with a main axis, a positioning device with a substrate holder which is displaceable relative to the focusing unit parellel to an X-direction which is perpendicular to the main axis and parallel to a Y-direction which is perpendicular to the X-direction and perpendicular to the main axis, a frame which supports at least the focusing unit parallel to a support direction, and a base which supports the frame by means of at least three support devices which each exert a support force on the frame which is directed parallel to the support direction, characterized in that each support device is a support device as claimed in claim 1.

7. A support device as in claim 1 wherein said pneumatic restriction is a permanently open passage which transmits high-frequency pressure fluctuations in the intermediate space to the pressure chamber only with strong damping, said high frequency pressure fluctuations having a frequency greater than 0.5 Hz.

8. A support device as in claim 7 wherein said high frequency pressure fluctuations have a frequency greater than 1.0 Hz.

* * * * *